(12) United States Patent
Yang et al.

(10) Patent No.: US 12,429,845 B2
(45) Date of Patent: Sep. 30, 2025

(54) TRANSPORT DEVICE INSPECTION SYSTEM INCLUDING DIAGNOSTIC SERVER AND METHOD OF OPERATION THEREOF

(71) Applicant: SAMSUNG ELECTRONICS CO., LTD., Suwon-si (KR)

(72) Inventors: Juho Yang, Suwon-si (KR); Heesoo Park, Hwaseong-si (KR); Joungtaek Yoon, Seoul (KR); Wongeun Lee, Seoul (KR); Jusung Lee, Suwon-si (KR)

(73) Assignee: Samsung Electronics Co., Ltd., Suwon-shi (KR)

( * ) Notice: Subject to any disclaimer, the term of this patent is extended or adjusted under 35 U.S.C. 154(b) by 766 days.

(21) Appl. No.: 17/721,502

(22) Filed: Apr. 15, 2022

(65) Prior Publication Data

US 2023/0152775 A1 May 18, 2023

(30) Foreign Application Priority Data

Nov. 18, 2021 (KR) .................... 10-2021-0159158

(51) Int. Cl.
*G05B 19/406* (2006.01)
*B65G 1/04* (2006.01)
(Continued)

(52) U.S. Cl.
CPC .......... *G05B 19/406* (2013.01); *B65G 1/0457* (2013.01); *G05B 19/4184* (2013.01);
(Continued)

(58) Field of Classification Search
CPC ............ G05B 19/406; G05B 19/41895; G05B 2219/31006; G05B 2219/37206; H04L 67/12; H01L 21/67733
See application file for complete search history.

(56) References Cited

U.S. PATENT DOCUMENTS 10,491,268 B2   11/2019   Oh et al.
10,604,899 B2    3/2020   Horii et al.
(Continued)

FOREIGN PATENT DOCUMENTS

JP    2006157919 A  *  6/2006  .......... H04L 43/0817
JP    2006-290177 A    10/2006
(Continued)

OTHER PUBLICATIONS

JP-2006157919-A (Year: 2006).*
Office Action in Korean Appln. No. 10-2021-0159158, mailed on Aug. 7, 2025, 13 pages (with English translation).

*Primary Examiner* — Thomas Randazzo
*Assistant Examiner* — Laurence R Brothers
(74) *Attorney, Agent, or Firm* — Fish & Richardson P.C.

(57) ABSTRACT

A transport device inspection system includes a plurality of transport devices configured to move along a transport path, a diagnostic server configured to create inspection schedule information for the plurality of transport devices, an inspector configured to receive the inspection schedule information from the diagnostic server and to sequentially inspect the plurality of transport devices in accordance with the inspection schedule information, and a transport device controller configured to receive the inspection schedule information (Continued)

from the inspector and to control the plurality of transport devices to sequentially move to an inspection position in accordance with the inspection schedule information.

22 Claims, 11 Drawing Sheets

(51) Int. Cl.
- *G05B 19/418* (2006.01)
- *G05B 23/02* (2006.01)
- *H01L 21/677* (2006.01)
- *H04L 67/12* (2022.01)
- *H01L 21/67* (2006.01)

(52) U.S. Cl.
CPC ....... *G05B 19/41895* (2013.01); *G05B 23/02* (2013.01); *H01L 21/6773* (2013.01); *H04L 67/12* (2013.01); *B65G 2201/0297* (2013.01); *G05B 2219/31006* (2013.01); *G05B 2219/37206* (2013.01); *H01L 21/67733* (2013.01)

(56) References Cited

U.S. PATENT DOCUMENTS

| | | | |
|---|---|---|---|
| 2011/0093160 A1* | 4/2011 | Ramseyer | G07C 5/008 701/31.4 |
| 2015/0075271 A1* | 3/2015 | Tracy | G01M 17/027 73/146 |
| 2015/0161826 A1* | 6/2015 | Yang | G07C 5/0841 701/29.6 |
| 2017/0076516 A1* | 3/2017 | Morita | B60R 16/02 |
| 2018/0100274 A1 | 4/2018 | Horii et al. | |
| 2019/0238182 A1 | 8/2019 | Oh et al. | |
| 2020/0320802 A1* | 10/2020 | Yang | B60W 50/0097 |
| 2020/0402221 A1* | 12/2020 | Ijiri | G06N 3/084 |
| 2021/0023723 A1* | 1/2021 | Jones | H04N 23/90 |
| 2021/0149401 A1 | 5/2021 | Kitamura | |
| 2021/0249297 A1 | 8/2021 | Chu et al. | |

FOREIGN PATENT DOCUMENTS

| | | |
|---|---|---|
| JP | 2006-315813 A2 | 11/2006 |
| JP | 4665592 B9 | 1/2011 |
| JP | 2011-085482 A2 | 4/2011 |
| KR | 2018-0093803 A | 8/2018 |
| KR | 2019-0028318 A | 3/2019 |
| KR | 10-2020-0130852 A | 11/2020 |

\* cited by examiner

| INSPECTION OBJECT ID | INSPECTION ORDER |
|---|---|
| ST01(100a) | 4 |
| ST02(100b) | 2 |
| ST03(100c) | 3 |
| ST04(100d) | 1 |

TRANSPORT DEVICE INSPECTION SYSTEM INCLUDING DIAGNOSTIC SERVER AND METHOD OF OPERATION THEREOF

CROSS-REFERENCE TO THE RELATED APPLICATION

This U.S. non-provisional patent application claims priority from Korean Patent Application No. 10-2021-0159158, filed on Nov. 18, 2021, in the Korean Intellectual Property Office, the disclosure of which is incorporated herein by reference in its entirety.

BACKGROUND

1. Field

The exemplary embodiments of the disclosure relate to a transport device inspection system for inspecting a transport device, and a method of operation thereof.

2. Description of the Related Art

A transport device, which is movable along a rail installed on a ceiling, is used in order to transport a wafer for manufacture of a semiconductor between pieces of processing equipment. Since the transport device is disposed at the rail installed on the ceiling, there is no method of checking a state of the transport device during operation of the transport device. For this reason, generally, maintenance of the transport device may be performed after breakdown of the transport device occurs. As such, the absence of a method for checking a state of the transport device before it breaks down may influence productivity of the semiconductor manufacturing facility and process. In addition, the transport device is configured to always move along the rail and, as such, stopping of any individual transport devices may interfere with movement of the remaining transport devices.

SUMMARY

The exemplary embodiments of the disclosure provide a transport device inspection system for efficiently inspecting a transport device, and a method of operation thereof.

A transport device inspection system according to an exemplary embodiment of the disclosure may include a plurality of transport devices, a diagnostic server, an inspector, and a transport device controller. The plurality of transport devices are configured to move along a transport path. The diagnostic server is configured to create inspection schedule information for the plurality of transport devices. The inspector is configured to receive the inspection schedule information from the diagnostic server and to sequentially inspect the plurality of transport devices in accordance with the inspection schedule information. The transport device controller is configured to receive the inspection schedule information from the inspector and to control the plurality of transport devices to sequentially move to an inspection position in accordance with the inspection schedule information.

A transport device inspection system according to an exemplary embodiment of the disclosure may include a plurality of transport devices, a diagnostic server, an inspector, and a transport device controller. The plurality of transport devices are configured to move along a transport path. The diagnostic server is configured to create inspection schedule information for the plurality of transport devices. The inspector is configured to receive the inspection schedule information from the diagnostic server and to sequentially inspect the plurality of transport devices in accordance with the inspection schedule information. The transport device controller is configured to receive the inspection schedule information from the inspector and to control the plurality of transport devices to sequentially move to an inspection position in accordance with the inspection schedule information. The inspector may include an inspection module configured to inspect a transport device having arrived at the inspection position. The diagnostic server may include a diagnostic unit configured to receive inspection results obtained after the inspector inspects the transport device and to analyze the inspection results, thereby diagnosing whether or not the transport device is abnormal.

A method of operation of a transport device inspection system according to an exemplary embodiment of the disclosure may include creating inspection schedule information for a plurality of transport devices, sequentially moving the plurality of transport devices to an inspection position in accordance with the inspection schedule information, inspecting the transport device having arrived at the inspection position, analyzing inspection results for the transport device, thereby diagnosing whether or not the transport device is abnormal, and moving the transport device to a transport path or moving the transport device to an exit of an inspector in accordance with diagnosis results for the transport device.

BRIEF DESCRIPTION OF THE DRAWINGS

FIG. 8 is a view showing inspection schedule information created by a diagnostic server according to an exemplary embodiment of the disclosure.

DETAILED DESCRIPTION OF EXEMPLARY EMBODIMENTS

Figure 1:
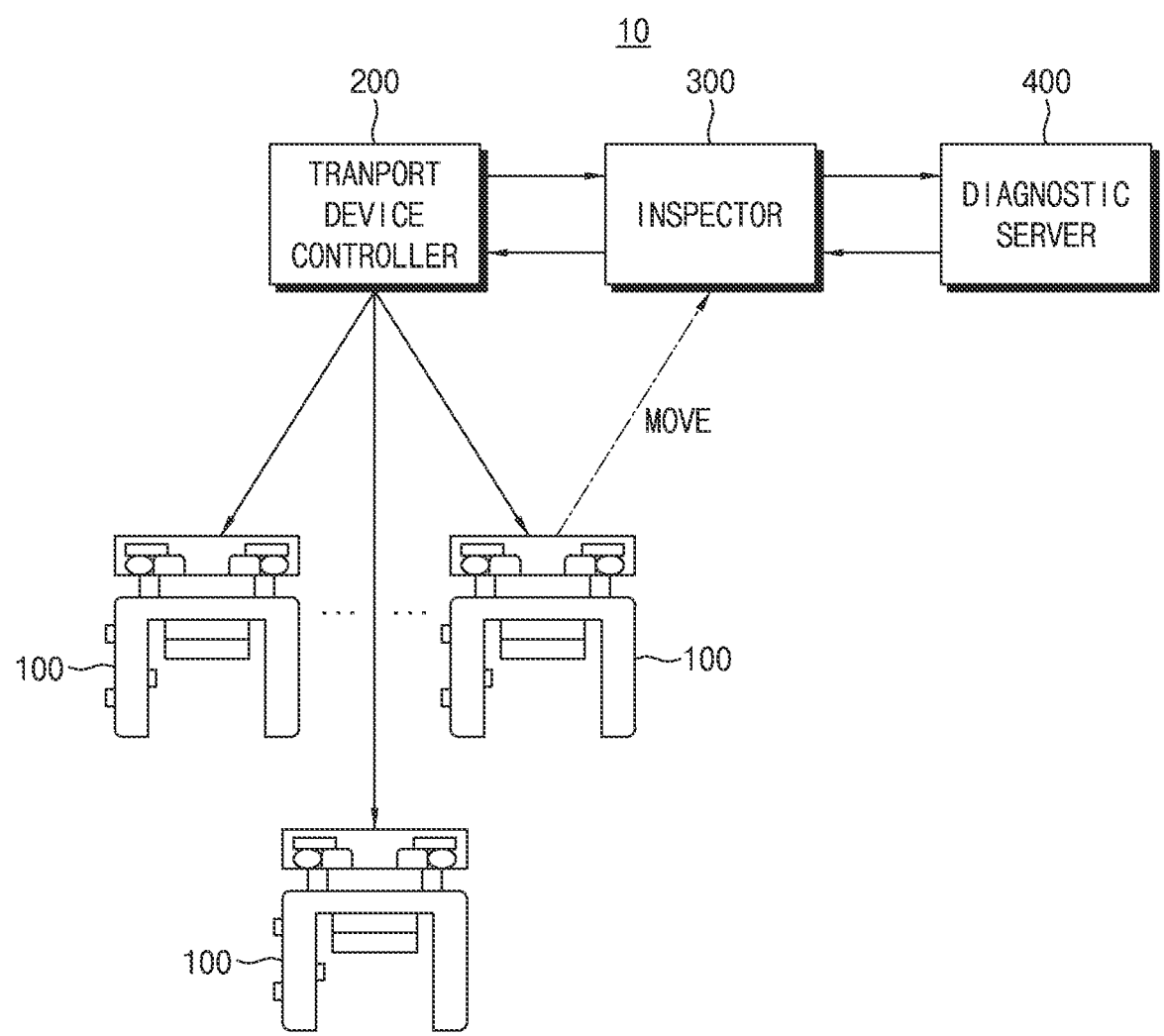
FIG. 1 is a schematic view of a transport device inspection system according to an exemplary embodiment of the disclosure.

FIG. 1 is a schematic view of a transport device inspection system according to an exemplary embodiment of the disclosure.

Referring to FIG. 1, a transport device inspection system 10 may include a plurality of transport devices 100, a transport device controller 200, an inspector 300, and a diagnostic server 400. The transport devices 100 are devices configured to carry materials in a factory and, for example, may be overhead hoist transfer (OHT) devices that include wheels or other mechanisms for moving. The materials may be a sealed container for receiving a wafer and, for example, may be a front open unified pod (FOUP).

Before proceeding, it should be clear that Figures herein, including FIG. 1 as described below, show and reference elements that are or include circuitry with labels such as "controller", "unit" including "control unit", "diagnostic unit", "scheduling unit", "interface unit" and "display unit", as well as "inspection module" or similar terms analogous to "circuit" or "block". As is traditional in the field of the inventive concept(s) described herein, examples may be described and illustrated in terms of such labelled elements which carry out a described function or functions. These labelled elements, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting such labelled elements may be implemented by dedicated hardware, or by a processor (e.g., one or more programmed microprocessors and associated circuitry), or by a combination of dedicated hardware to perform some functions of the labelled element and a processor to perform other functions of the labelled element. Each labelled element of the examples may be physically separated into two or more interacting and discrete circuits without departing from the scope of the present disclosure.

The transport devices 100 may move along a transport path installed in a factory. The transport path may be generally installed at a factory ceiling, and may be formed by a rail so that the transport devices 100 are suspended at or below the factory ceiling by the rail. As described herein, the rail may include multiple sections of rails, such as a first rail and a second rail, and the rail may include diverging paths. The transport devices 100 may load materials, and may then unload the materials at a desired position after moving along the transport path. For example, the transport devices 100 may transport materials to suitable semiconductor processing equipment in accordance with a semiconductor process sequence while passing through the transport path. In addition, when inspection of the transport devices 100 is required, the transport devices 100 may move to an inspection position, at which inspection may be performed, along the transport path.

The transport device controller 200 may manage overall movement and transport of the transport devices 100. That is, the transport device controller 200 controls the plurality of transport devices 100, including a transport device corresponding to a current inspection order from among the plurality of transport devices 100. The transport device controller 200 may include, for example, a memory that stores instructions and a processor that executes the instructions to implement the functions attributed herein to the transport device controller 200. The transport device controller 200 may also include other circuit elements such as a transmitter, a receiver, and/or a transceiver, as well as interface circuits for interfacing with other electronic systems, devices and/or components. The transport devices 100 may move in accordance with a control command of the transport device controller 200 and, as such, may transport materials. The transport device controller 200 may control the transport devices 100 to move to suitable semiconductor processing equipment in accordance with a semiconductor process sequence and then to load or unload materials. In addition, the transport device controller 200 may control the transport devices 100 to move to an inspection position, at which the transport devices 100 may be subjected to appropriate inspection, in accordance with inspection schedule information for the transport devices 100. The transport device controller 200 may operate in accordance with knowledge of a plurality of inspection positions, such as distances between a sequence of inspection positions, and/or location information specifying the locations of each inspection position.

The inspector 300 may perform inspection to check whether or not the transport devices 100 have one or more abnormality. The transport devices 100 may sequentially arrive at the inspection position after moving along the transport path in accordance with the control command of the transport device controller 200. For example, the inspection position may correspond to the position of the inspector 300. The inspector 300 may inspect the transport device 100 having arrived at the inspection position. For example, the inspector 300 may inspect the appearance of the transport device 100 or may inspect driving of the transport device 100. The inspector 300 may also inspect information from the transport device 100, such as from a control unit 140 and/or from a sensor unit 130.

The diagnostic server 400 may diagnose whether or not an abnormality exists in each of the transport devices 100. The diagnostic server 400 may receive inspection results for the transport devices 100 from the inspector 300, and may diagnose whether or not the abnormality exists in each of the transport devices 100, through the inspection results. The diagnostic server 400 may store inspection results and/or diagnosis results.

The diagnostic server 400 may manage inspection of checking whether or not the transport devices 100 have one or more abnormality. The diagnostic server 400 may create inspection schedule information for the transport devices 100. Inspection schedule information may be or include information as to an inspection order of the transport devices 100 to be subjected to inspection by the inspector 300. Details of creation of the inspection schedule information by the diagnostic server 400 will be described later. The diagnostic server 400 may transmit the inspection schedule information to the transport device controller 200 via the inspector 300. The transport device controller 200 may control the transport devices 100 in accordance with the inspection schedule information received thereto. The inspector 300 may inspect the transport devices 100 in accordance with the inspection schedule information.

The diagnostic server 400 may create the inspection schedule information for the transport devices 100 based on information stored in the diagnostic server 400 or based on state information of each of the plurality of transport devices 100 received from the plurality of transport devices 100. Also, or alternatively, the diagnostic server 400 may create the inspection schedule information by receiving information used to execute the inspection from the user. For example, the user may provide the diagnostic server 400 with an inspection object and/or an inspection schedule.

Figure 2:
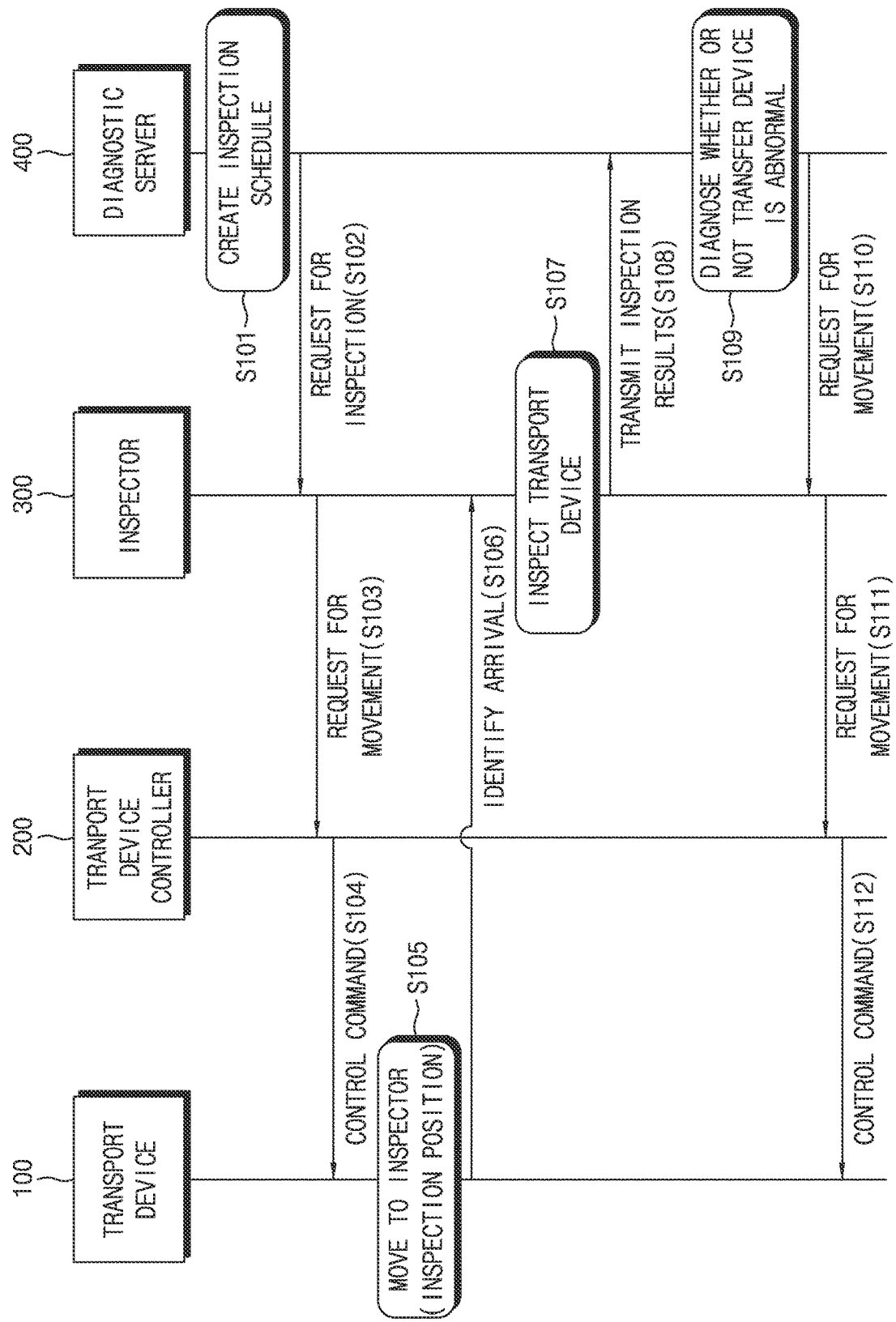
FIG. 2 is a flowchart explaining a method of operation of the transport device inspection system of FIG. 1.

FIG. 2 is a flowchart explaining a method of operation of the transport device inspection system of FIG. 1.

Referring to FIG. 2, the diagnostic server 400 may create inspection schedule information for the transport devices 100 (S101). The diagnostic server 400 may transmit an inspection request for the transport devices 100 to the inspector 300 while transmitting inspection schedule information to the inspector 300 (S102). The inspector 300 may receive the inspection schedule information and the inspection request from the diagnostic server 400. In response to the inspection request, the inspector 300 may transmit the inspection schedule information to the transport device controller 200, and may request that the transport device controller 200 control the transport devices 100 to move to the inspector 300 (S103). For example, the request may include a sequence and/or times at which the transport devices 100 are to be controlled to move to the inspector 300. The transport device controller 200 may control the transport devices 100 to move to the inspector 300 (that is, an inspection position) in response to a movement request from the inspector 300 (S104). The transport device controller 200 may receive the inspection schedule information, and may control the transport devices 100 to move to the inspector 300 in accordance with the inspection schedule information.

When at least one of the transport devices 100 arrives at the inspection position or an entrance of the inspector 300 (S105), the arrived transport device 100 may inform the inspector 300 of arrival thereof at the inspection position or the entrance, through communication with the inspector 300 (S106). For example, the arrived transport device 100 may include a wireless communication module such as for Bluetooth or near-field communication (NFC) to wirelessly communicate with a wireless module of the inspector 300. The entrance of the inspector 300 may be any position of the transport device 100 before the transport device 100 arrives at the inspection position, and may be a position adjacent to the inspector 300. When the transport device 100 arrives at the entrance of the inspector 300, the inspector 300 may identify arrival of the transport device 100, and may then control the transport device 100 to move to the inspection position. The inspector 300 may inspect the transport device 100 having arrived at the inspection position (S107). After performing the inspection of the transport device 100, the inspector 300 may transmit inspection results to the diagnostic server 400 (S108). As noted above, for example, the inspector 300 may include a wireless communication module such as for Bluetooth or near-field communication (NFC) to wirelessly communicate with a wireless module of the diagnostic server 400.

The diagnostic server 400 may receive the inspection results, and may analyze the inspection results, thereby diagnosing whether or not the inspected transport device 100 is abnormal (S109). After performing diagnosis through analysis of the inspection results, the inspector 300 may request that the inspector 300 move the transport device 100, based on the diagnosis results (S110). For example, the diagnostic server 400 may request movement of the transport device 100 by transmitting the diagnosis results to the inspector 300.

When the transport device 100 is diagnosed as normal or is to be requested to appear for inspection, the diagnostic server 400 may request that the inspector 300 move the transport device 100 from the inspector 300 (that is, the inspection position) to the outside (S110). In accordance with the movement request, the inspector 300 may request that the transport device controller 200 move the transport device 100 to the outside of the inspector 300 (S111). In addition, the inspector 300 may request that the transport device controller 200 control the transport device 100 to move once outside of the inspector 300. In accordance with the movement request and the control request, the transport device controller 200 may move the transport device 100 to the outside of the inspector 300, and may control movement and transport of the transport device 100 at the outside of the inspector 300 (S112). That is, the transport device controller 200 may control the transport device 100, which has been diagnosed as normal or which is to be requested for inspection, to transport materials along the transport path after departing from the inspector 300.

When the transport device 100 is diagnosed as abnormal (or is to be urgently inspected), the diagnostic server 400 may request that the inspector 300 move the transport device 100 to an exit through a lifter (S110). In accordance with the movement request, the inspector 300 may move the transport device 100 to an exit thereof through the lifter. For example, the transport device 100 moved to the exit may be subjected to inspection or repair for a configuration which has one or more abnormality.

In an embodiment, when the transport device 100 has been diagnosed and is to be requested for inspection, the diagnostic server 400 may output diagnosis results to the user, may then receive control information for the transport device 100 from the user, and may then control the transport device 100 in accordance with the control information. For example, the user may control the transport device 100, which has been diagnosed and is to be requested for inspection, to move to the outside of the inspector 300 for transport of materials, or to move to the exit through the lift for inspection.

Figure 3:
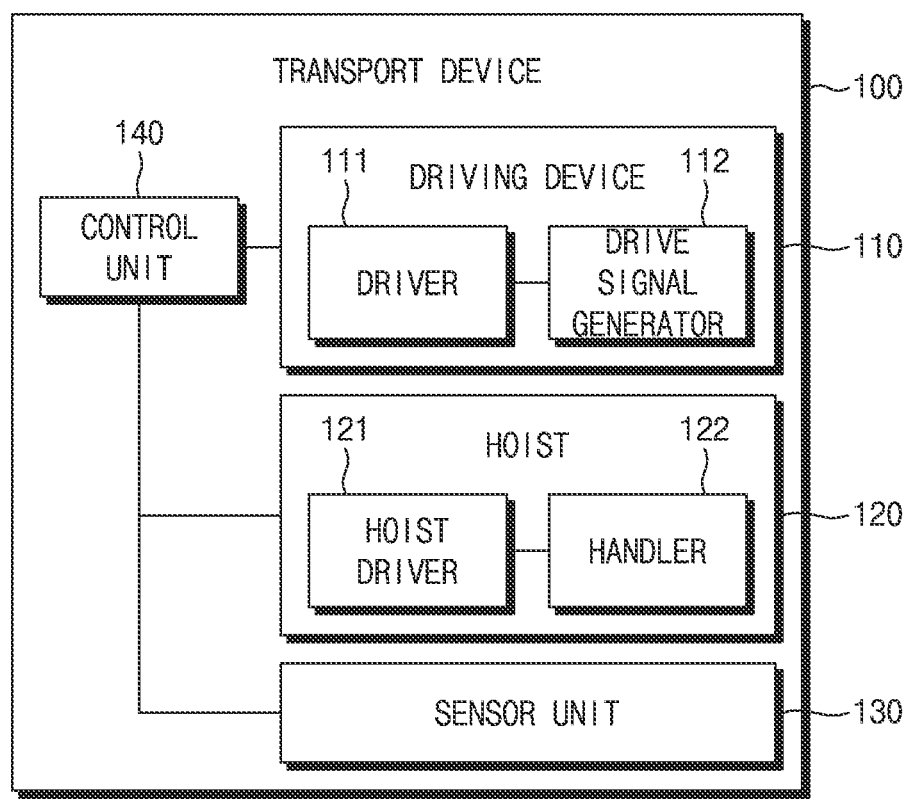
FIG. 3 is a block diagram illustrating a configuration of the transport device of FIG. 1.
Figure 4:
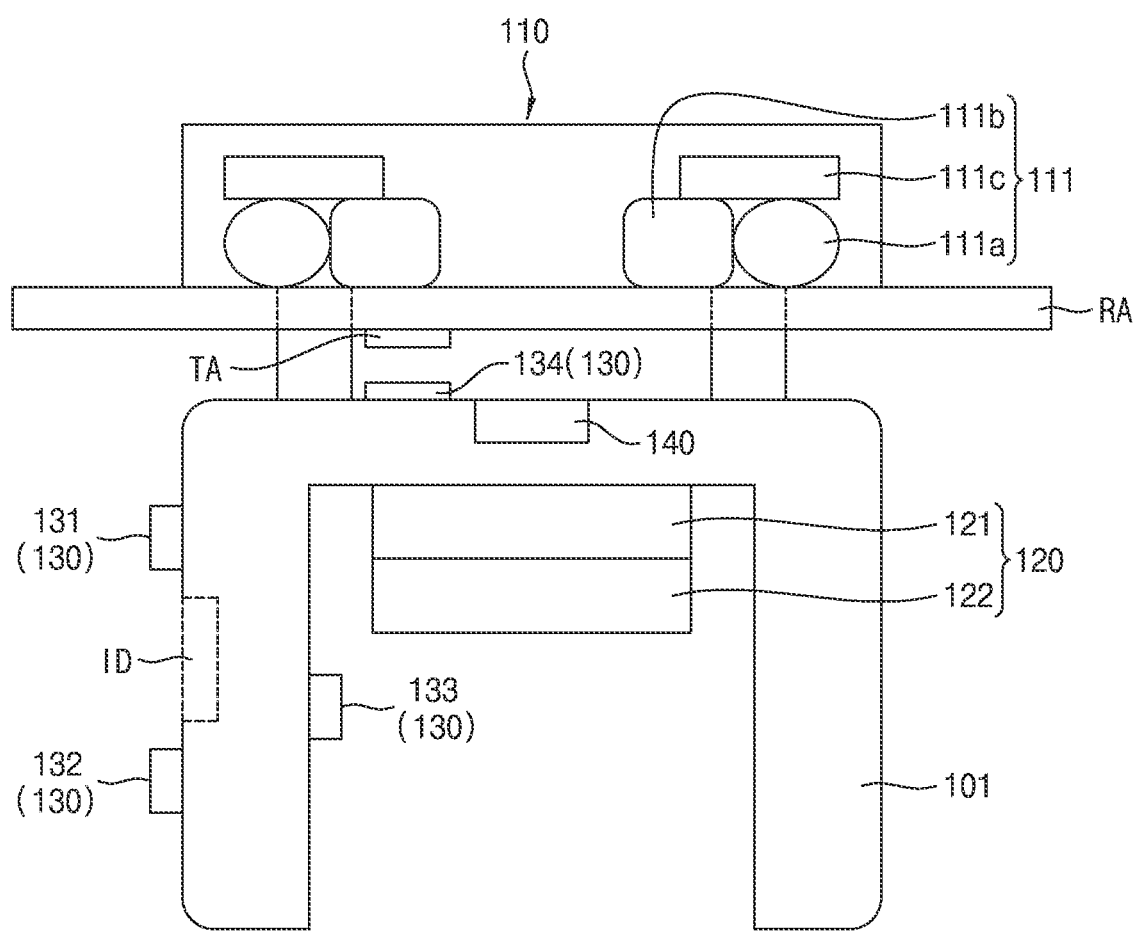
FIG. 4 is a sectional view illustrating the transport device of FIG. 1.

FIG. 3 is a block diagram illustrating a configuration of the transport device of FIG. 1. FIG. 4 is a sectional view illustrating the transport device of FIG. 1.

Referring to FIG. 1, FIG. 3, and FIG. 4, the transport device 100 may be hanging on and suspended from a rail RA forming a transport path. The transport device 100 may include a body 101, a driving device 110, a hoist 120, a sensor unit 130, and a control unit 140. The driving device 110, the hoist 120, the sensor unit 130, and the control unit 140 may be connected to the body 101. An equipment name ID of the transport device 100 may be indicated at a portion of a surface of the body 101, and may be used in communications and processing to identify each instance of the transport device 100.

The driving device 110 may include a driving unit 111 configured to enable the transport device 100 to move along the transport path. For example, the driving unit 111 may include a wheel 111a, a motor 111b configured to drive the wheel 111a, and a steering unit 111c configured to adjust a direction of the wheel 111a. The driving device 110 may further include a drive signal generator 112. The drive signal generator 112 may generate driving information for the driving unit 111. For example, the driving information may include velocity (angular velocity) and/or torque of the motor 111b. The steering unit 111c may be used to adjust the direction of travel of the transport device 100, such as to move along one of two or more potential segments of the transport path.

The hoist 120 may include a handler 122 disposed at an inside of the body 101, and configured to load or unload materials, and a hoist driver 121 configured to enable the handler 122 to move in a vertical direction or to move in a horizontal direction. Although not shown, the hoist 120 may further include a hoist drive signal generator. For example, the hoist drive signal generator may generate driving information such as velocity (angular velocity) and/or torque of a motor included in the hoist driver 121.

The sensor unit 130 may be attached to the body 101, and may sense a driving state of the transport device 100 or a peripheral environmental state of the transport device 100. For example, the sensor unit 130 may include a carrier sensor 131, an obstacle sensor 132, a material sensor 133, a tag recognition sensor 134 and/or another type of sensor. The carrier sensor 131 may sense whether or not another transport device 100 is in front of the transport device 100. The obstacle sensor 132 may sense whether or not there is an obstacle on a track on which the transport device 100 will travel. The material sensor 133 may sense whether or not materials have been loaded in the handler 122 of the hoist 120. The tag recognition sensor 134 may recognize a tag TA attached to the rail RA (that is, the transport path). In addition to the above-described sensors, the sensor unit 130 may include sensors configured to sense and measure a driving state of the transport device 100 such as vibration, noise, speed, etc. of the driving unit 111 or the hoist driver 121.

The control unit 140 may control the driving device 110, the hoist 120 and the sensor unit 130 in accordance with a control command of the transport device controller 200. The control unit 140 may move the transport device 100 along the transport path by controlling the driving unit 111 of the driving device 110. The control unit 140 may move the handler 122 upwards and downwards or left and right and may control the handler 122 to load materials or to provide materials to processing equipment by controlling the hoist driver 121. The control unit 140 may control the sensor unit 130 to sense a driving state of the transport device 100 or a peripheral environmental state of the transport device 100.

The control unit 140 may receive state information including at least one of a drive signal of the driving unit 111, a drive signal of the hoist driver 121, a driving state of the transport device 100, and tag recognition information from the drive signal generator 112 of the driving device 110, the hoist drive signal generator of the hoist 120, and the sensor unit 130. The control unit 140 may transmit the received state information to the diagnostic server 400. Although not shown, the transport device 100 may further include a communication unit, and the control unit 140 may transmit the state information to the diagnostic server 400 via the communication unit. A communication unit may include a wireless communication module that communicates via Bluetooth, near-field communication (NFC) or another type of protocol, and/or may include a wired interface that communicates such as by ethernet.

Figure 5:
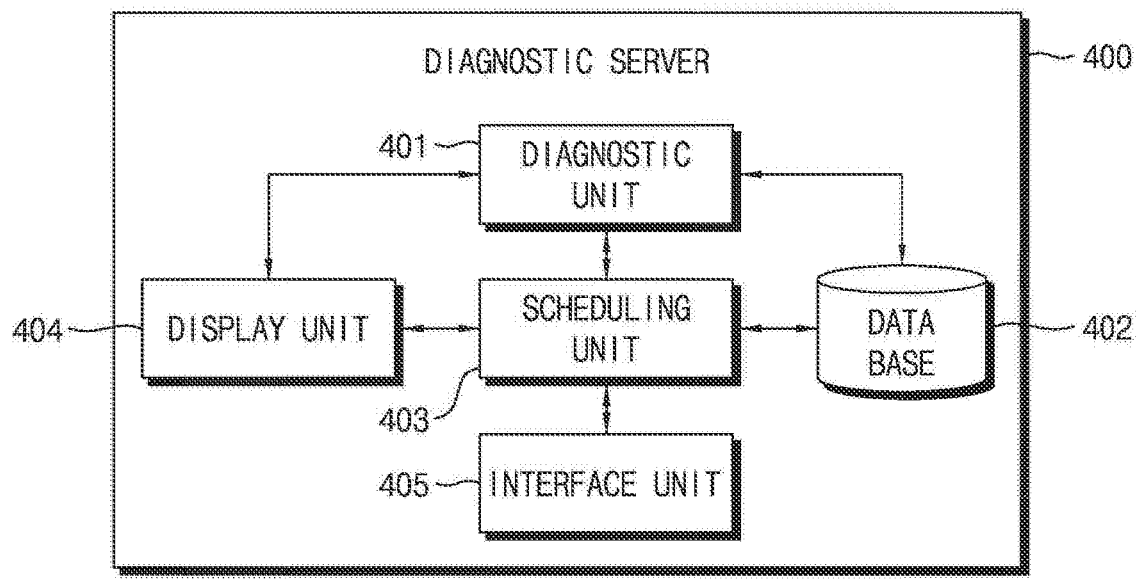
FIG. 5 is a block diagram illustrating a configuration of the diagnostic server of FIG. 1.

FIG. 5 is a block diagram illustrating a configuration of the diagnostic server of FIG. 1.

Referring to FIG. 1 and FIG. 5, the diagnostic server 400 may include a diagnostic unit 401, a database 402, a scheduling unit 403, a display unit 404, and an interface unit 405. The diagnostic server 400 may further include a communication unit that communicates wirelessly and/or over a wire.

The diagnostic server 400 may receive pieces of state information for the transport devices 100 from the transport devices 100 via the communication unit thereof, respectively. The diagnostic unit 401 may analyze the received state information pieces, thereby diagnosing whether or not the respective transport devices 100 have one or more abnormality.

The diagnostic unit 401 may receive inspection results for the transport devices 100 from the inspector 300 via the communication unit. The diagnostic unit 401 may analyze the received inspection results, thereby diagnosing whether or not the respective transport devices 100 have one or more abnormality.

Diagnosis results obtained through diagnosis by the diagnostic unit 401 may be stored in the database 402, together with the inspection results. The diagnostic unit 401 may output the diagnosis results to the user through the display unit 404. Diagnosis results may be stored in the database 402, and may subsequently be used when the scheduling unit 403 creates inspection schedule information.

The database 402 may store information as to the transport devices 100. The database 402 may store state information received from the transport devices 100 and inspection results previously obtained through inspection of the transport devices 100 by the inspector 300, as described above, and may also store diagnosis results obtained after the diagnostic unit 401 analyzes the state information and the inspection results and diagnoses whether or not the respective transport devices 100 have one or more abnormality, based on analysis results. For example, the database 402 may store usage (for example, period(s) of use) of each of the transport devices 100, the number of times when each of the transport devices 100 was subjected to inspection, the number of times when each of the transport devices 100 was diagnosed as abnormal, and/or information as to a configuration which has one or more abnormality, etc. in each of the transport device 100. The database 402 may store at least one of state information, inspection results and diagnosis results for each transport device 100, corresponding to the equipment name ID of the transport device 100.

The scheduling unit 403 may create inspection schedule information for the transport devices 100. For example, the inspection schedule information may include equipment name IDs of inspection objects to be inspected from among the transport devices 100, and an inspection order of the inspection objects. The scheduling unit 403 may provide the inspection schedule information to the inspector 300 via the communication unit.

In an embodiment, the scheduling unit 403 may receive diagnosis results from the diagnostic unit 401, and may create inspection schedule information based on the diagnosis results. For example, when the diagnostic unit 401 receives state information of the transport devices 100 from the transport devices 100, and then analyzes the state information, thereby generating diagnosis results, the scheduling unit 403 may receive the diagnosis results from the diagnostic unit 401, and may create inspection schedule information based on the diagnosis results. When the diagnostic unit 401 receives inspection results for the transport devices 100 from the inspector 300, and then analyzes the inspection results, thereby creating diagnosis results, the scheduling unit 403 may receive the diagnosis results from the diagnostic unit 401, and may then create inspection schedule information based on the diagnosis results. For example, the scheduling unit 403 may create inspection schedule information for the transport devices 100 diagnosed as abnormal from among the transport devices 100 transmitting state information, in accordance with the diagnosis results. The scheduling unit 403 may determine an inspection order in which the transport devices 100 diagnosed as abnormal are subjected to inspection through the inspector 300.

In an embodiment, the scheduling unit 403 may create inspection schedule information based on information stored in the database 402. The scheduling unit 403 may determine an inspection order of the transport devices 100 based on the information stored in the database 402. For example, the scheduling unit 403 may create inspection schedule information such that inspection is performed, starting from the transport device 100 having the greatest length of time since the transport device 100 was previously diagnosed as abnormal among a plurality of transport devices 100. Also, or alternatively, the order may be created based on the number of inspections elapsed since the transport devices 100 were previously diagnosed as abnormal, so that transport devices 100 with the largest number of successful inspections may still be prioritized for future inspections. For example, in the case in which the number of inspection times when a first transport device 100a was previously diagnosed as abnormal is three, the number of inspection times when a second transport device 100b was previously diagnosed as abnormal is two, and the number of inspection times when a third transport device 100c was previously diagnosed as abnormal is five, the scheduling unit 403 may determine the inspection order of the third transport device 100c to be first, may determine the inspection order of the first transport device 100a to be second, and may determine the inspection order of the second transport device 100b to be third.

Alternatively, the order may be created so that the transport devices 100 with the smallest number of successful inspections may be prioritized for future inspections. For example, the scheduling unit 403 may create inspection schedule information such that inspection is performed, starting from the transport device 100 having a smaller number of inspection times since the transport device 100 was previously diagnosed as abnormal compared to the remaining transport devices 100. For example, in the case in which the number of inspection times when the first transport device 100a was previously diagnosed as abnormal is five, the number of inspection times when the second transport device 100b was previously diagnosed as abnormal is three, and the number of inspection times when the third transport device 100c was previously diagnosed as abnormal is one, the scheduling unit 403 may determine the inspection order of the third transport device 100c to be first, may determine the inspection order of the second transport device 100b to be second, and may determine the inspection order of the first transport device 100a to be third.

Alternatively, the order may be created based on the total number of times the transport devices 100 were diagnosed as abnormal and the total number of inspection times of the transport devices 100. For example, the scheduling unit 403 may create inspection schedule information based on the numbers of inspection times when the transport devices 100 were previously diagnosed as abnormal, respectively, and the numbers of times when the transport devices 100 were previously subjected to inspection, respectively. For example, the scheduling unit 403 may determine an inspection order of the transport devices 100 in accordance with the numbers of times when the transport devices 100 were previously diagnosed as abnormal, respectively, and when multiple of the transport devices 100 have equal numbers of times when the transport devices 100 were previously diagnosed as abnormal, respectively, in accordance with the numbers of times when the transport devices 100 were previously subjected to inspection, respectively. Alternatively, the scheduling unit 403 may not only determine an inspection order of the transport devices 100 in accordance with the numbers of times when the transport devices 100 were previously subjected to inspection, respectively, and when multiple of the transport devices 100 have equal numbers of times when the transport devices 100 were previously subjected to inspection, respectively, in accordance with the numbers of times when the transport devices 100 were previously diagnosed as abnormal, respectively.

In an embodiment, the scheduling unit 403 may create inspection schedule information based on information received from the user. The scheduling unit 403 may receive information for creation of inspection schedule information from the user via the interface unit 405. The user may designate, through the interface unit 405, inspection objects to be subjected to inspection from among the transport devices 100, and may determine an inspection order of the inspection objects. The display unit 404 may output information as to the transport devices 100 based on information stored in the database 402, and the user may identify the information as to the transport devices 100 through the display unit 404 and may input inspection objects and an inspection order through the interface unit 405 based on the identified information. The scheduling unit 403 may crease inspection schedule information in accordance with the inspection objects and the inspection order input by the user through the interface unit 405.

Figure 6:
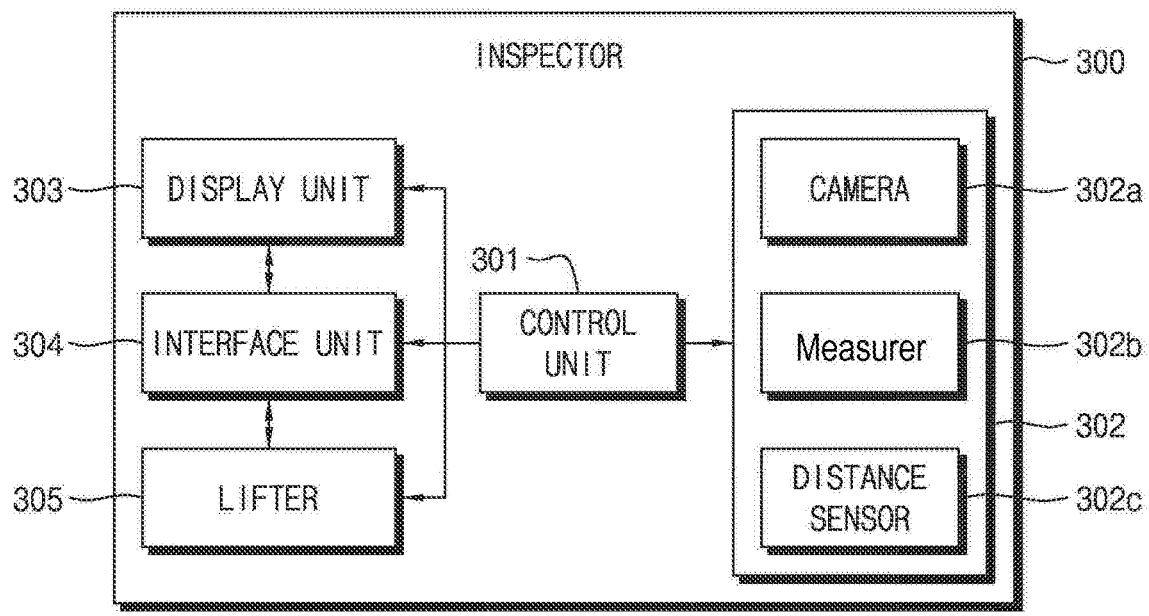
FIG. 6 is a block diagram illustrating a configuration of the inspector of FIG. 1.

FIG. 6 is a block diagram illustrating a configuration of the inspector of FIG. 1.

Referring to FIG. 1 and FIG. 6, the inspector 300 may include a control unit 301, an inspection module 302, a display unit 303, an interface unit 304, and a lifter 305. The inspector 300 may further include a communication unit.

The control unit 301 may include a memory that stores instructions and a processor that executes the instructions to implement the functions attributed herein to the control unit 301. The control unit 301 may also include other circuitry and circuit elements, such as a transmitter, receiver or transceiver configured to communicate. The control unit 301 may receive inspection schedule information from the diagnostic server 400. The control unit 301 may receive the inspection schedule information via the communication unit thereof. The control unit 301 may transmit the received inspection schedule information to the transport device controller 200. Through transmission of the inspection schedule information to the transport device controller 200, the control unit 301 requests that the transport device controller 200 move the transport devices 100 in accordance with the inspection schedule information.

When the transport device 100 arrives at the inspection position or the entrance of the inspector 300, the control unit 301 may communicate with the transport device 100, thereby identifying arrival of the transport device 100. After identifying arrival of the transport device 100, the control unit 301 may check, through the inspection module 302, whether or not the transport device 100 is a current inspection object. For example, the control unit 301 may control a camera 302a included in the inspection module 302 and, as such, the camera 302a may photograph the equipment name (for example, ID) of the transport device 100 having arrived at the inspection position. The control unit 301 may analyze a photographed image, thereby recognizing the equipment name, and may then compare the recognized equipment name with the inspection schedule information. The control unit 301 may check whether or not the transport device 100 having the recognized equipment name is a transport device corresponding to an inspection order for execution of a current inspection. Alternatively, the control unit 301 may receive the equipment name of the transport device 100 having arrived at the inspection position or the entrance of the inspector 300, through communication with the transport device 100, and, as such, may check whether or not the transport device 100 is a transport device corresponding to a current inspection order.

When the transport device 100 having arrived at the inspection position or the entrance of the inspector 300 is the transport device corresponding to the inspection order for execution of the current inspection, the control unit 301 may control the inspection module 302, thereby performing inspection of the transport device 100. For example, when the transport device 100 having arrived at the entrance of the inspector 300 is the transport device corresponding to the inspection order for execution of the current inspection, the control unit 301 may control the transport device 100 to move from the entrance to the inspection position, through communication with the transport device 100, and inspection may then be performed.

The inspection module 302 may operate in accordance with a control signal of the control unit 301 and, as such, may perform inspection of the transport device 100 having arrived at the inspection position. For example, the inspection module 302 may include at least one of a camera 302a, a measurer 302b, and a distance sensor 302c. Of course, the exemplary embodiments of the disclosure are not limited to the above-described case, and, otherwise, the inspection module 302 may include another inspection device capable of observing a state of the transport device 100.

The control unit 301 may receive, from the inspection module 302, inspection results obtained through inspection of the transport device 100, and may transmit the inspection results to the diagnostic server 400 via the communication unit. Alternatively, the inspection module 302 may directly transmit the inspection results to the diagnostic server 400 via the communication unit. The control unit 301 may receive diagnosis results obtained after the diagnostic server 400 diagnoses whether or not the transport device 100 is abnormal, based on the inspection results. The control unit 301 may output the received diagnosis results to the display unit 303. The display unit 303 may be configured to output the diagnosis results. The user may identify the diagnosis results not only through the display unit 404 of the diagnostic server 400, but also through the display unit 303 of the inspector 300.

The inspector 300 may receive control information for the transport device 100 which has completed inspection from the user via the interface unit 304. The user may identify diagnosis results for the transport device 100 which has completed inspection through the display unit 303, and may input, to the inspector 300 via the interface unit 304, control information as to how the transport device 100 should be controlled in accordance with the diagnosis results. The control unit 301 may receive the control information via the interface unit 304, and may then control the transport device 100 in accordance with the control information. Alternatively, the control unit 301 may receive the control information via the interface unit 304, and may then transmit the received control information to the transport device controller 200 via the communication unit.

The lifter 305 may move the transport device 100 which has completed the inspection. The lifter 305 may move the transport device 100 downwards, thereby moving the transport device 100 to the exit. The control unit 301 controls the lifter 305 in accordance with the diagnosis results for the transport device 100 received from the diagnostic server 400. For example, when the diagnosis results for the transport device 100 received from the diagnostic server 400 represent one or more identified abnormality, the control unit 301 may control the lifter 305, thereby moving the transport device 100 to the exit. When the diagnosis results for the transport device 100 received from the diagnostic server 400 represent normal, the control unit 301 may not operate the lifter 305. When the diagnosis results for the transport device 100 received from the diagnostic server 400 represent normal, the transport device controller 200 may control the transport device 100. The transport device controller 200 may control the transport device 100 to move to the outside of the inspector 300. The transport device controller 200 may control the transport device 100 to move in accordance with a process sequence. Alternatively, the control unit 301 may control the lifter 305 in accordance with the control information received through the interface unit 304.

Figure 7:
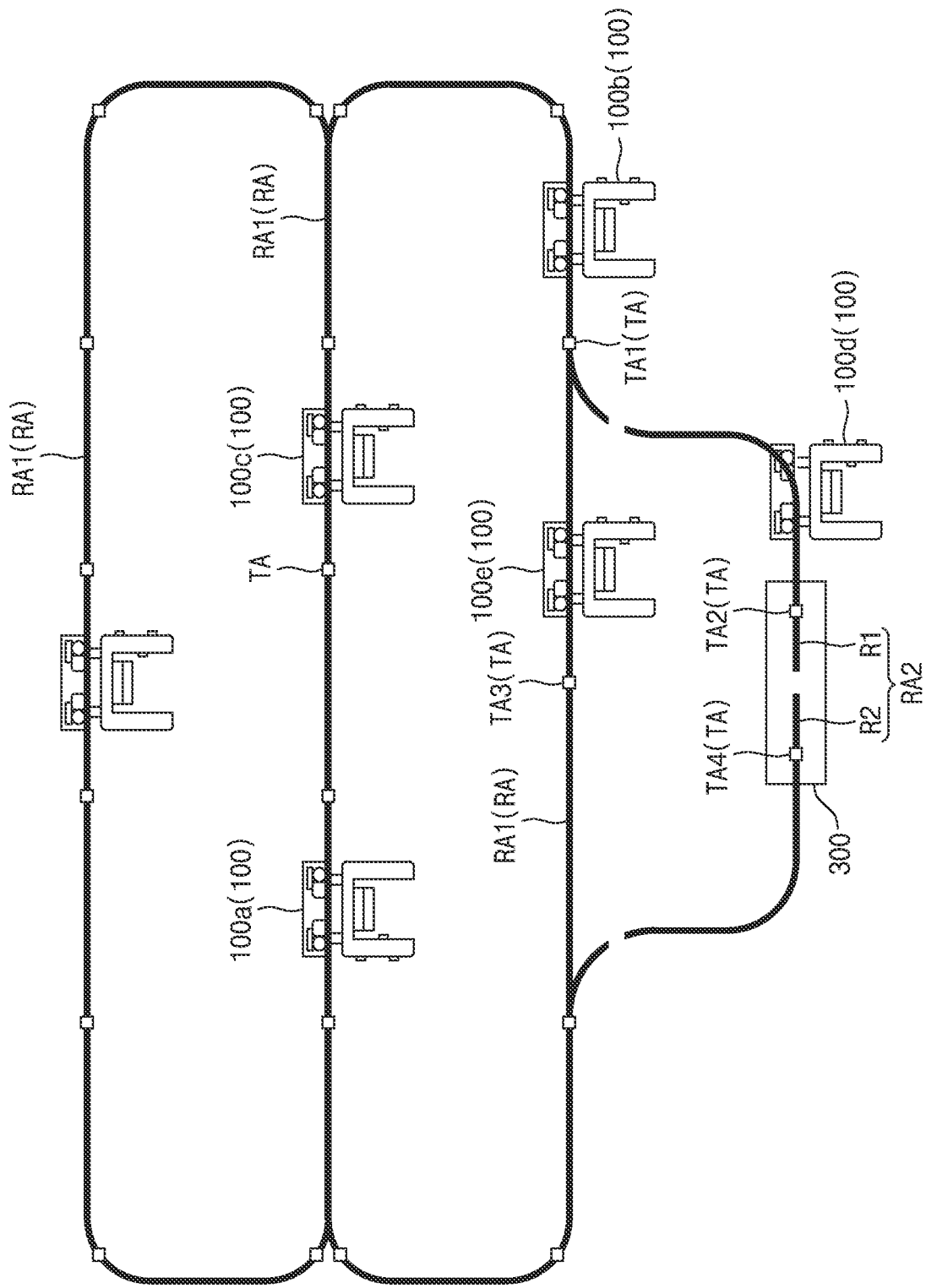
FIG. 7 is a view explaining a transport device inspection system according to an exemplary embodiment of the disclosure.

FIG. 7 is a view explaining a transport device inspection system according to an exemplary embodiment of the disclosure. FIG. 8 is a view showing inspection schedule information created by a diagnostic server according to an exemplary embodiment of the disclosure.

Referring to FIG. 1, FIG. 4, and FIG. 7, transport devices 100 may move along a transport path RA. A plurality of tags T may be installed on the transport path RA. Each of the transport devices 100 may recognize the tag TA through a tag recognition sensor 134 included therein. For example, the tag TA may be constituted by a barcode, text, an image, or a combination thereof. Each of the transport devices 100 may recognize the tag T, and may then create position information representing a position at which the transport device 100 is disposed, on the transport path RA. A transport device controller 200 may receive the position information from the transport device 100 and, as such, may identify the position, at which the transport device 100 is disposed, on the transport path RA and may control movement of the transport device 100 in accordance with the position information.

The transport path RA may include a first path RA1 and a second path RA2. For example, the first path RA1 may be installed to enable the transport devices 100 to transport materials to processing equipment, etc. while passing through the first path RA1, and the second path RA2 may be installed to enable the transport devices 100 to be inspected by an inspector 300 while passing through the second path RA2. The inspector 300 may be installed on the second path RA2. For example, the second path RA2 may be branched from the first path RA1. The transport device controller 200 may control the transport devices 100 to transport materials to suitable processing equipment while moving along the first path RA1.

Referring to FIG. 1, FIG. 7, and FIG. 8, the transport devices 100 may move on the first path RA1 and the second path RA2 in accordance with inspection schedule information 1. When the transport device controller 200 receives the inspection schedule information 1 from the inspector 300, the transport device controller 200 may control the transport devices 100 to move on the first path RA1 and the second path RA2 in accordance with the inspection schedule information 1. The transport device controller 200 may control the transport devices 100 to sequentially enter the second path RA2 and then to move to the inspector 300 (that is, the inspection position) in accordance with an inspection order of the transport devices 100 included in the inspection schedule information 1. The transport device controller 200 may control the transport devices 100, which do not correspond to a current inspection order, not to enter the second path RA2 or not to arrive at the inspector 300 while the transport device 100 corresponding to the current inspection order is inspected by the inspector 300 after moving to the inspector 300 in accordance with the inspection schedule information 1. In addition, the transport device controller 200 may control the transport devices 100, which are not included, as inspection objects, in the received inspection schedule information 1, to transport materials to suitable processing equipment while continuously moving on the first path RA1.

In an embodiment, the transport device inspection system may include a first transport device 100a, a second transport device 100b, a third transport device 100c, a fourth transport device 100d, and a fifth transport device 100e. Of course, this case is only illustrative, and the number of transport devices is not limited thereto. For example, an equipment name ID of the first transport device 100a is ST01, an equipment name ID of the second transport device 100b is ST02, an equipment name ID of the third transport device 100c is ST03, an equipment name ID of the fourth transport device 100d is ST04, and an equipment name ID of the fifth transport device 100e is ST05.

The transport device controller 200 may move the first transport device 100a, the second transport device 100b, the third transport device 100c and the fourth transport device 100d to the inspector 300 in an order of the fourth transport device 100d, the second transport device 100b, the third transport device 100c and the first transport device 100a in accordance with the inspection schedule information 1. First, the transport device controller 200 may move the fourth transport device 100d, the inspection order of which is first, to the inspector 300 or the entrance of the inspector 300. The fourth transport device 100d may arrive at a first position, at which a first tag TA1 is disposed, in the middle of movement thereof along the first path RA1. For example, the first position, at which the first tag TA1 is disposed, may be a branch point of the first path RA1 and the second path RA2. The fourth transport device 100d may recognize the first tag TA1 through a tag recognition sensor thereof and, as such, may create tag recognition information. The transport device controller 200 may receive the tag recognition information and, as such, may recognize that the fourth transport device 100d has arrived at the first position. The transport device controller 200 may control the fourth transport device 100d having arrived at the first position to enter the second path RA2. The fourth transport device 100d may move toward the inspector 300 disposed on the second path RA2. A second tag TA2 may be installed at the inspection position of the inspector 300. Alternatively, the fourth transport device 100d may arrive at the entrance of the inspector 300 first. The fourth transport device 100d having arrived at the entrance of the inspector 300 may communicate with the inspector 300 and, as such, may inform the inspector 300 of arrival at the entrance. The inspector 300 may check whether or not the fourth transport device 100d is equipment corresponding to the current inspection order, and may then move the fourth transport device 100d to the inspection position. In an embodiment, the fourth transport device 100d may, at the first position, inform the inspector 300 of arrival at the first position. The inspector 300 may check whether or not the fourth transport device 100d having arrived at the first position is the equipment corresponding to the current inspection order, and may then move the fourth transport device 100d to the inspection position.

The transport device controller 200 may control the first transport device 100a, the second transport device 100b, and the third transport device 100c not to enter the second path RA2 while the fourth transport device 100d is subjected to inspection at the inspection position. For example, when the second transport device 100b, which corresponds to an order (for example, a second order) just next to the current inspection order (for example, a first order), arrives at the first portion, the transport device controller 200 may control the second transport device 100b to wait at the first position. When the third transport device 100c, the first transport device 100a or the fifth transport device 100e, which does not correspond to the order just next to the current inspection order (for example, corresponding to a third order or a fourth order or not being an inspection object), arrives at the first position, the transport device controller 200 may control the third transport device 100c, the first transport device 100a or the fifth transport device 100e to move to a position, at which a third tag TA3 is disposed, on the first path RA1.

In an embodiment, after the inspection of the fourth transport device 100d is completed, the transport device controller 200 may align the first transport device 100a, the second transport device 100b, and the third transport device 100c in the vicinity of the first position in advance in accordance with an inspection order in order to enable the first transport device 100a, the second transport device 100b and the third transport device 100c to move in accordance with the inspection order.

After completion of the inspection of the fourth transport device 100d, the fourth transport device 100d may depart from the inspection position. The inspector 300 may move the fourth transport device 100d to the exit through the lifter, or the transport device controller 200 may control the fourth transport device 100d to again enter the first path RA1. When the fourth transport device 100d is moved to the exit through the lifter, the inspector 300 may move the fourth transport device 100d to a position, at which a fourth tag TA4 is disposed, on the second path RA2.

When the fourth transport device 100d departs from the inspection position, the transport device controller 200 may move the second transport device 100b, the inspection order of which is second, to the inspection position. The procedure of moving the second transport device 100b to the inspection position may be performed in the same manner as the above-described procedure of moving the fourth transport device 100d to the inspection position. Thereafter, the above-described procedure may be sequentially applied to the third transport device 100c, the inspection order of which is third, and the first transport device 100a, the inspection order of which is fourth, in the same manner.

Figure 9:
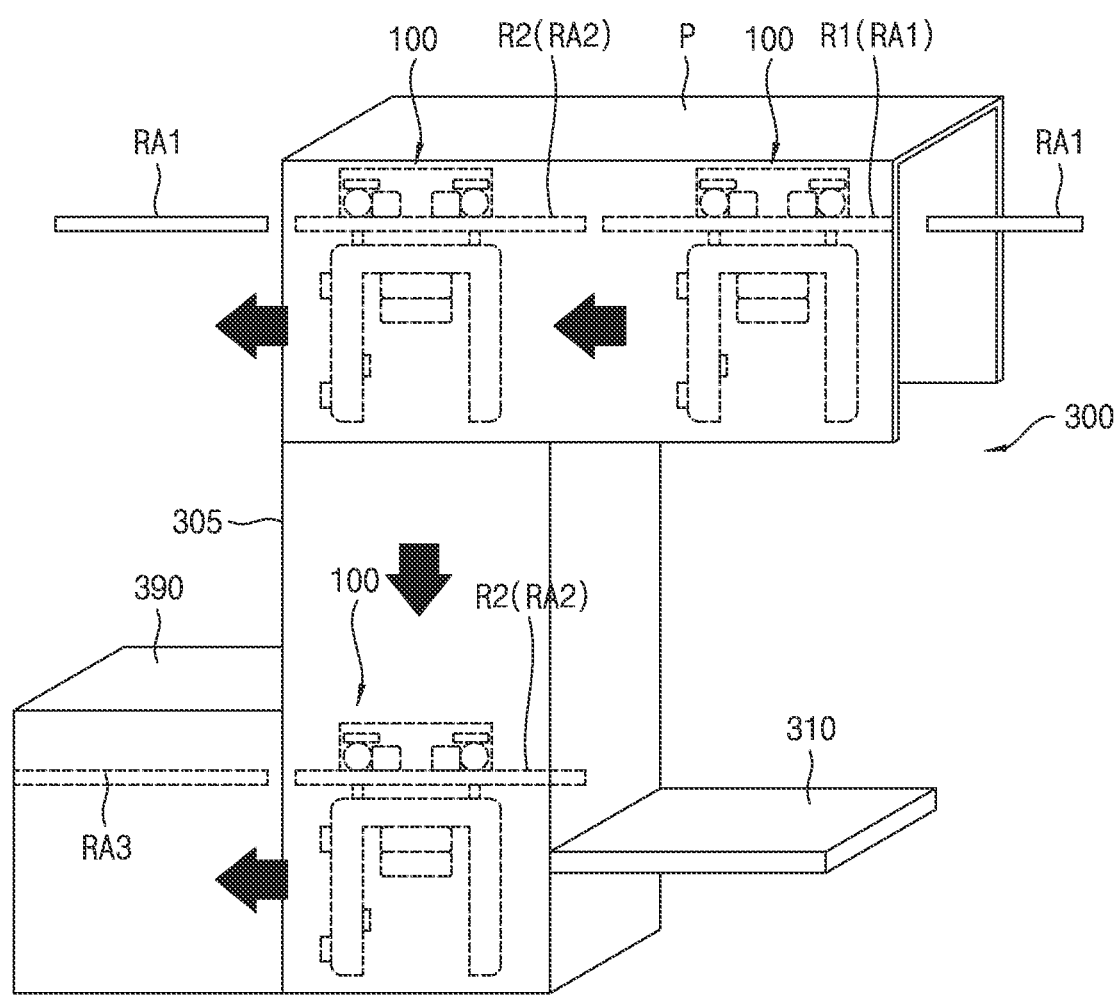
FIG. 9 is a view showing movement of a transport device in an inspector according to an exemplary embodiment of the disclosure.
Figure 10:
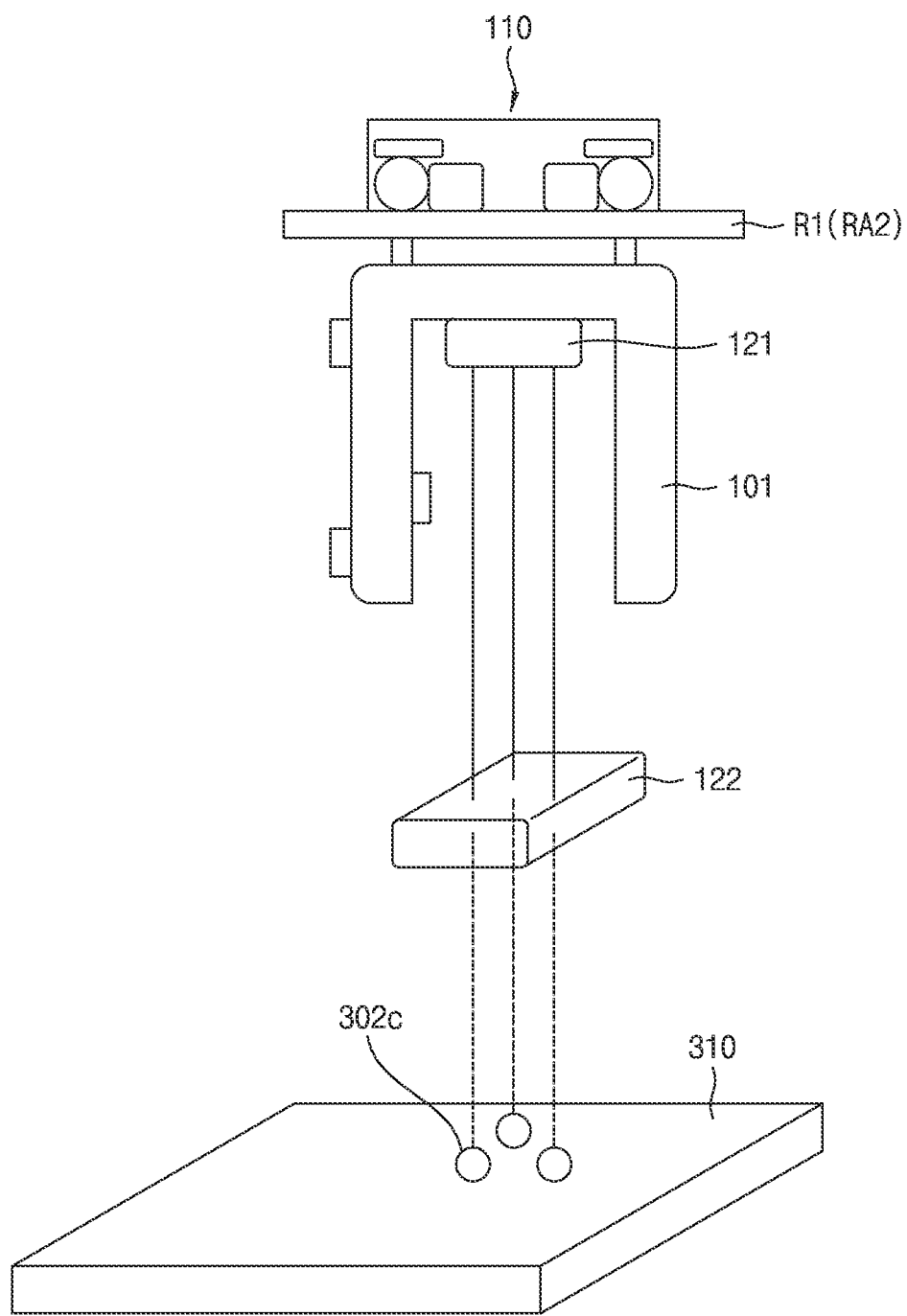
FIG. 10 shows inspection of a transport device using a distance sensor included in an inspector according to an exemplary embodiment of the disclosure.
Figure 11:
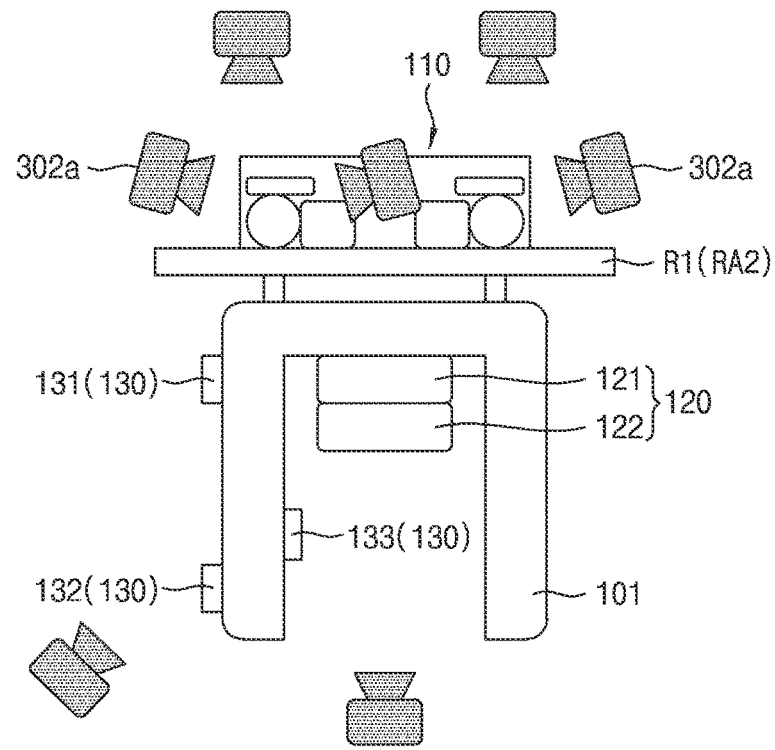
FIG. 11 shows inspection of a transport device using a camera included in an inspector according to an exemplary embodiment of the disclosure.
Figure 12:
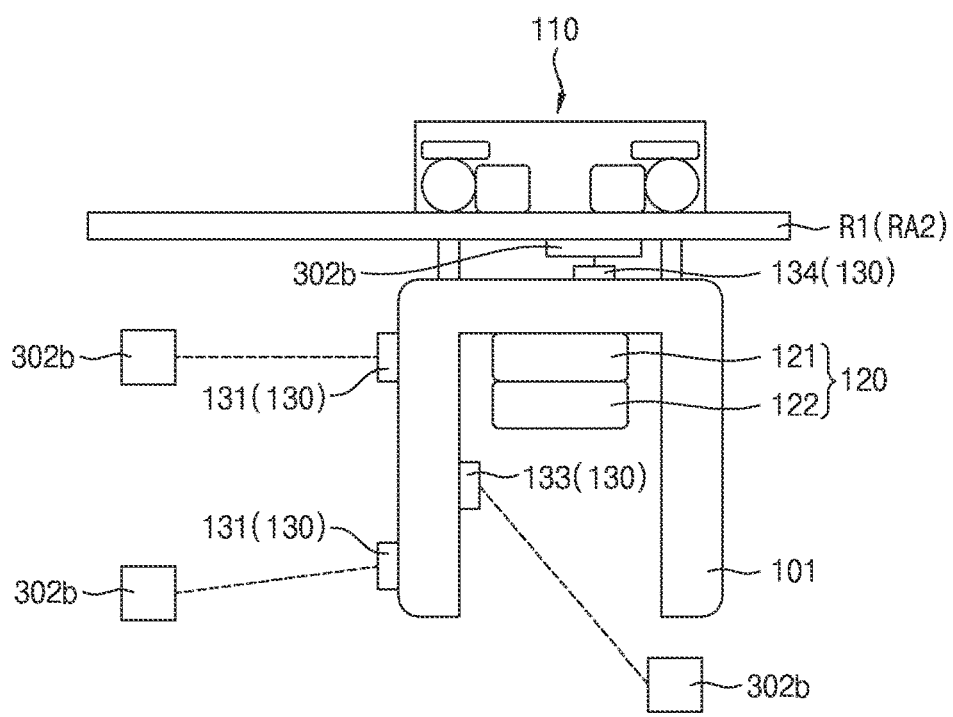
FIG. 12 shows inspection of a transport device using an inspection measurer included in an inspector according to an exemplary embodiment of the disclosure.
Figure 13:
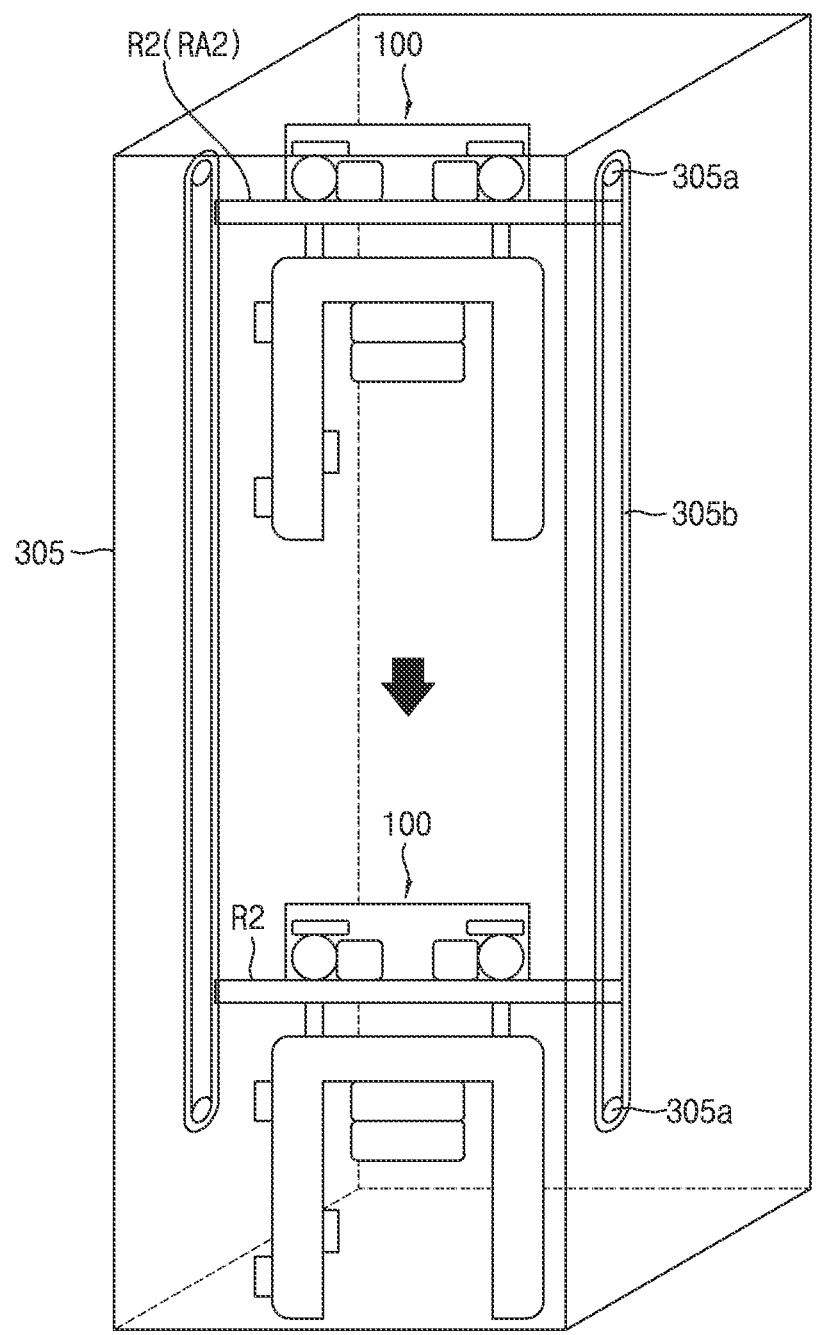
FIG. 13 shows operation of a lifter included in an inspector according to an exemplary embodiment of the disclosure.

FIG. 9 is a view showing movement of a transport device in an inspector according to an exemplary embodiment of the disclosure. FIG. 10 shows inspection of a transport device using a distance sensor included in an inspector according to an exemplary embodiment of the disclosure. FIG. 11 shows inspection of a transport device using a camera included in an inspector according to an exemplary embodiment of the disclosure. FIG. 12 shows inspection of a transport device using an inspection measurer included in an inspector according to an exemplary embodiment of the disclosure. FIG. 13 shows operation of a lifter included in an inspector according to an exemplary embodiment of the disclosure.

Referring to FIG. 7 and FIG. 9, the second path RA2 may include a first rail R1 and a second rail R2. The first rail R1 may be branched from the first path RA1. The first rail R1 may be spaced apart from the first path RA1 and, as such, vibration from the first path RA1 may not be transmitted to the first rail R1. The second rail R2 may be branched from the first path RA1. The second rail R2 may be disposed between the first rail R1 and the first path RA1. The second rail R2 may be spaced apart from the first path RA1 and, as such, vibration from the first path RA1 may not be transmitted to the second rail R2. The second rail R2 may also be spaced apart from the first rail R1, or may be separably connected to the first rail R1.

Referring to FIG. 9 to FIG. 13, an inspector 300 may include a panel P, a port 310, a camera 302a, a measurer 302b, a lifter 305, and an exit 390. The panel P may be disposed on the second path RA2. The panel P may surround at least parts of the first rail R1 and the second rail R2 of the second path RA2. The panel P may be disposed on a top surface and opposite side surfaces of the second path RA2, and may be open downwards. A transport device 100 may pass through an inside of the panel P while moving along the second path RA2. The panel P may prevent light from leaking outwards when the inspector 300 photographs the transport device 100 using the camera 302a.

Referring to FIG. 6, FIG. 9, and FIG. 10, the port 310 may be disposed under the first rail R1. A distance sensor 302c may be provided at the port 310. The distance sensor 302c may check whether or not a handler 122 of the transport device 100 is horizontally maintained during vertical movement thereof. For example, the distance sensor 302c may be disposed in plural on the port 310 such that the plurality of distance sensors 302c are spaced apart from one another, and each of the plurality of distance sensors 302c may measure a distance therefrom to a bottom surface of the handler 122. A control unit 301 of the inspector 300 may transmit the measured distance to a diagnostic server 400, and a diagnostic unit 401 of the diagnostic server 400 may check whether or not the handler 122 is horizontally maintained, based on the measured distance, thereby diagnosing whether or not the transport device 100 is abnormal.

Referring to FIG. 6, FIG. 9, and FIG. 11, the inspector 300 may include the camera 302a. The camera 302a may be disposed at the inside of the panel P, and may further be disposed at the outside of the panel P. The camera 302a may photograph the appearance of a transport device 100 having arrived at the first rail R1. Cameras 302a may be installed at positions where the cameras 302a can easily photograph configurations of the transport device 100 having arrived at the first rail R1, respectively.

In an embodiment, materials may be provided on the port 310. The transport device 100 may load the materials provided on the port 310. Otherwise, the transport device 100 may unload, on the port 310, materials loaded therein. The camera 302a may photograph a shape of the transport device 100 loading or unloading materials.

The control unit 301 of the inspector 300 may transmit, to the diagnostic server 400, a video or image photographed by the camera 302a, and the diagnostic unit 401 of the diagnostic server 400 may then analyze the photographed video or image, thereby diagnosing whether or not the transport device 100 is abnormal.

Referring to FIG. 6, FIG. 9, and FIG. 12, the inspector 300 may include the measurer 302b. The measurer 302b may be disposed at the inside of the panel P, and may further be disposed at the outside of the panel P. The measurer 302b may inspect states of multiple instances of the sensor unit 130 included in a transport device 100 having arrived at the first rail R1. The measurer 302b may receive light emitted from each instance of the sensor unit 130 and, as such, may measure an amount of light or may identify positions irradiated with light by each of the sensor unit 130.

The control unit 301 of the inspector 300 may transmit measurement results for light from each instance of the sensor unit 130 to the diagnostic server 400, and the diagnostic unit 401 of the diagnostic server 400 may then analyze the light measurement results, thereby diagnosing whether or not the transport device 100 is abnormal.

Referring to FIG. 1 and FIG. 9 to FIG. 12, the inspector 300 may perform inspection of a transport device 100 having arrived at the first rail R1. The inspector 300 may inspect whether or not the transport device 100 is abnormal, using the camera 302a, the measurer 302b and the distance sensor 302c. After completing the inspection of the transport device 100, the inspector 300 may move the transport device 100 to the second rail R2. After completing the inspection of the transport device 100, the inspector 300 may transmit inspection results to the diagnostic server 400, and may then receive, from the diagnostic server 400, diagnosis results obtained after the diagnostic server 400 diagnoses whether or not the transport device 100 is abnormal. When the diagnosis results represent normal, the inspector 300 may control the transport device 100 to again enter the first path RA1 after passing through the second rail R2.

Referring to FIG. 13, the lifter 305 may move the second rail R2 upwards and downwards. For example, the lifter 305 may have a configuration in which a belt 305b or a chain is connected to a rotational body 305a rotatable by a motor, and the second rail R2 may be connected to the belt 305b or the chain. The lifter 305 may move the second rail R2 upwards and downwards in accordance with movement of the belt 305b or the chain. For example, the control unit 301 may be configured to control the lifter 305 to move the second rail downwards when the diagnosis results represent abnormal.

Of course, the configuration of the lifter 305 is not limited to the above-described configuration, and another embodiment capable of moving the second rail R2 upwards and downwards may be applied.

In an embodiment, when the transport device 100 is determined to be abnormal, the lifter 305 may move the second rail R2 downwards. The second rail R2 may move downwards through the lifter 305 and, as such, may be aligned with a third rail RA3 disposed at the exit 390. The transport device 100 may move to the exit 390 through the third rail RA3.

In accordance with an exemplary embodiment of the disclosure, a transport device inspection system capable of automatically inspecting transport devices in accordance with a predetermined inspection order may be provided and, as such, it may be possible to efficiently and safely inspect a transport device and to prevent degradation of productivity of a semiconductor production line caused by failure of a transport device.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A system, comprising:
 a plurality of transport devices configured to move along a transport path;
 a diagnostic server configured to create inspection schedule information for the plurality of transport devices;
 an inspector configured to receive the inspection schedule information from the diagnostic server and to sequentially inspect the plurality of transport devices in accordance with the inspection schedule information; and a transport device controller configured to receive the inspection schedule information from the inspector and to control the plurality of transport devices to sequentially move to an inspection position in accordance with the inspection schedule information.

2. The system according to claim 1, wherein:
the transport device controller is configured to control a transport device corresponding to a current inspection order from among the plurality of transport devices to move to the inspection position; and
the transport device controller is configured to control transport devices not corresponding to the current inspection order not to move to the inspection position.

3. The system according to claim 1, wherein the inspector comprises:
an inspection module configured to inspect a transport device disposed at the inspection position; and
a control unit configured to receive inspection results from the inspection module and to transmit the received inspection results to the diagnostic server.

4. The system according to claim 3, wherein the control unit is configured to:
communicate with a transport device that has arrived at an entrance of the inspector,
based on communicating with the transport device that has arrived at the entrance of the inspector, identify an arrival of the transport device that has arrived at the entrance of the inspector, and
check whether the transport device that has arrived at the entrance of the inspector is a transport device corresponding to a current inspection order.

5. The system according to claim 3, wherein the diagnostic server comprises a diagnostic unit configured to analyze the inspection results to obtain diagnosis results indicating whether the transport device is abnormal, and
wherein the diagnostic server is configured to transmit the diagnosis results to the inspector.

6. The system according to claim 5, wherein:
the control unit is configured to request that the transport device controller move the transport device to a first position based on the diagnosis results representing a normal state or a request for inspection; and
wherein the control unit is configured to move the transport device to a second position based on the diagnosis results representing an abnormal state.

7. The system according to claim 5, wherein the diagnostic server comprises:
a database configured to store the diagnosis results; and
a scheduling unit configured to create the inspection schedule information based on diagnosis results stored in the database.

8. The system according to claim 7, wherein:
the diagnostic server comprises:
a display unit configured to output the diagnosis results, and
an interface unit configured to receive, from a user, information for creation of the inspection schedule information; and
the scheduling unit is configured to create the inspection schedule information based on the information received at the interface unit.

9. The system according to claim 5, wherein:
the transport path comprises:
a first path installed adjacent to processing equipment, and
a second path branched from the first path; and
the inspector is installed on the second path.

10. The system according to claim 9, wherein the second path comprises:
a first rail comprising the inspection position; and
a second rail separated from the first rail.

11. The system according to claim 10, wherein the inspector comprises a lifter configured to move the second rail upwards and downwards.

12. The system according to claim 11, wherein the control unit is configured to control the lifter to move the second rail downwards based on the diagnosis results representing an abnormal state.

13. A system, comprising:
a plurality of transport devices configured to move along a transport path;
a diagnostic server configured to create inspection schedule information for the plurality of transport devices;
an inspector configured to receive the inspection schedule information from the diagnostic server and to sequentially inspect the plurality of transport devices in accordance with the inspection schedule information; and
a transport device controller configured to receive the inspection schedule information from the inspector and to control the plurality of transport devices to sequentially move to an inspection position in accordance with the inspection schedule information,
wherein the inspector comprises an inspection module configured to inspect a transport device that has arrived at the inspection position, and
wherein the diagnostic server comprises a diagnostic unit configured to receive inspection results obtained after the inspector inspects the transport device and to analyze the inspection results to diagnose whether the transport device is abnormal.

14. The system according to claim 13, wherein:
the transport device controller is configured to control a transport device corresponding to a current inspection order, from among the plurality of transport devices, to move to the inspection position; and
the transport device controller is configured to control transport devices not corresponding to the current inspection order not to move to the inspection position.

15. The system according to claim 13, wherein:
the inspector comprises a control unit configured to receive diagnosis results for the transport device and to output the diagnosis results through a display unit;
the control unit is configured to request that the transport device controller move the transport device to a first position based on the diagnosis results representing a normal state or a request for inspection; and
the control unit is configured to move the transport device to a second position based on the diagnosis results representing an abnormal state.

16. The system according to claim 15, wherein:
the transport path comprises a rail providing the inspection position; and
the inspector comprises a lifter configured to move the rail upwards and downwards.

17. A method of operation of a system, the method comprising:
creating inspection schedule information for a plurality of transport devices;
communicating the inspection schedule information to an inspector;
sequentially moving the plurality of transport devices to an inspection position in accordance with the inspection schedule information;

checking, by the inspector, whether a transport device that has arrived at the inspection position is a current transport device in agreement with the inspection schedule information;

based on determining that the transport device is the current transport device, inspecting the transport device using the inspector;

analyzing inspection results for the transport device to obtain diagnosis results indicating whether the transport device is abnormal; and moving the transport device to a transport path or moving the transport device to an exit of the inspector based on the diagnosis results.

18. The method according to claim 17, wherein creating the inspection schedule information comprising determining an inspection order of the plurality of transport devices based on diagnosis results for the plurality of transport devices stored in a database.

19. The method according to claim 18, wherein the diagnosis results comprise at least one of:

numbers of times the plurality of transport devices were subjected to inspection, respectively, or numbers of times the plurality of transport devices were diagnosed as abnormal, respectively.

20. The method according to claim 17, wherein creating the inspection schedule information comprising creating the inspection schedule information for the plurality of transport devices based on state information of each of the plurality of transport devices, wherein the state information is received from the plurality of transport devices.

21. The method according to claim 17, wherein checking whether the transport device is the current transport device comprises:

capturing, by the inspector, an image of the transport device; and determining whether the transport device is the current transport device based on the image.

22. The method according to claim 17, wherein checking whether the transport device is the current transport device comprises:

communicating, by the inspector, with the transport device to determine whether the transport device is the current transport device.

* * * * *